US006977547B2

(12) United States Patent
Udupa et al.

(10) Patent No.: US 6,977,547 B2
(45) Date of Patent: Dec. 20, 2005

(54) MINIMIZING CHANGES IN THE AMPLIFICATION FACTOR OF AN AMPLIFICATION CIRCUIT DURING OPERATION

(75) Inventors: Anand Hariraj Udupa, Bangalore (IN); Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 10/722,409

(22) Filed: Nov. 28, 2003

(65) Prior Publication Data

US 2005/0116772 A1 Jun. 2, 2005

(51) Int. Cl.[7] .................................................. H03F 3/45

(52) U.S. Cl. .......................................... 330/69; 330/254

(58) Field of Search ............................. 330/69, 75, 278

(56) References Cited

U.S. PATENT DOCUMENTS 3,875,523 A * 4/1975 Wade et al. .................. 330/69
5,990,737 A * 11/1999 Czarnul et al. ............... 330/69
6,150,881 A * 11/2000 Lovelace et al. ........... 330/252
6,545,534 B1 * 4/2003 Mehr .......................... 330/69

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

A resistor (or a component with impedance that does not change) is provided across the output of an amplifier, which minimizes the changes in the amplification factor of an amplification circuit during operation.

6 Claims, 5 Drawing Sheets

300
160-A
110-C
CM
130
101-A
110-A
150
151
350
135
+ −
390
125
− +
101-B
110-B
120
152
CM
110-D
160-B

MINIMIZING CHANGES IN THE AMPLIFICATION FACTOR OF AN AMPLIFICATION CIRCUIT DURING OPERATION

BACKGROUND OF THE INVENTION

1. Field of the Invention

The present invention relates to the design of electrical circuits, and more specifically to a method and apparatus for minimizing the changes in the amplification factor of an amplification circuit during operation.

2. Related Art

Amplification circuits are often used to amplify an input signal and generate a corresponding output signal. The ratio of signal levels of the output signal and the input signal defines the amplification factor of the amplification circuit.

It is generally desirable to keep the amplification factor of an amplification circuit constant, i.e., should not change, during operation. Such a constant amplification factor ensures that linearity of response (at the output) is maintained. Linearity in turn implies that the signal presented for subsequent processing (after amplification) accurately represents the input signal.

BRIEF DESCRIPTION OF THE DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

According to an aspect of the present invention, a resistor is provided across the output of an amplifier used in an amplification circuit. Due to the use of the resistor, the changes in the amplification factor of the amplification circuit are minimized. This results in the transfer function between the input and output of the amplification circuit to be more linear.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Amplification Circuit

Figure 1A:
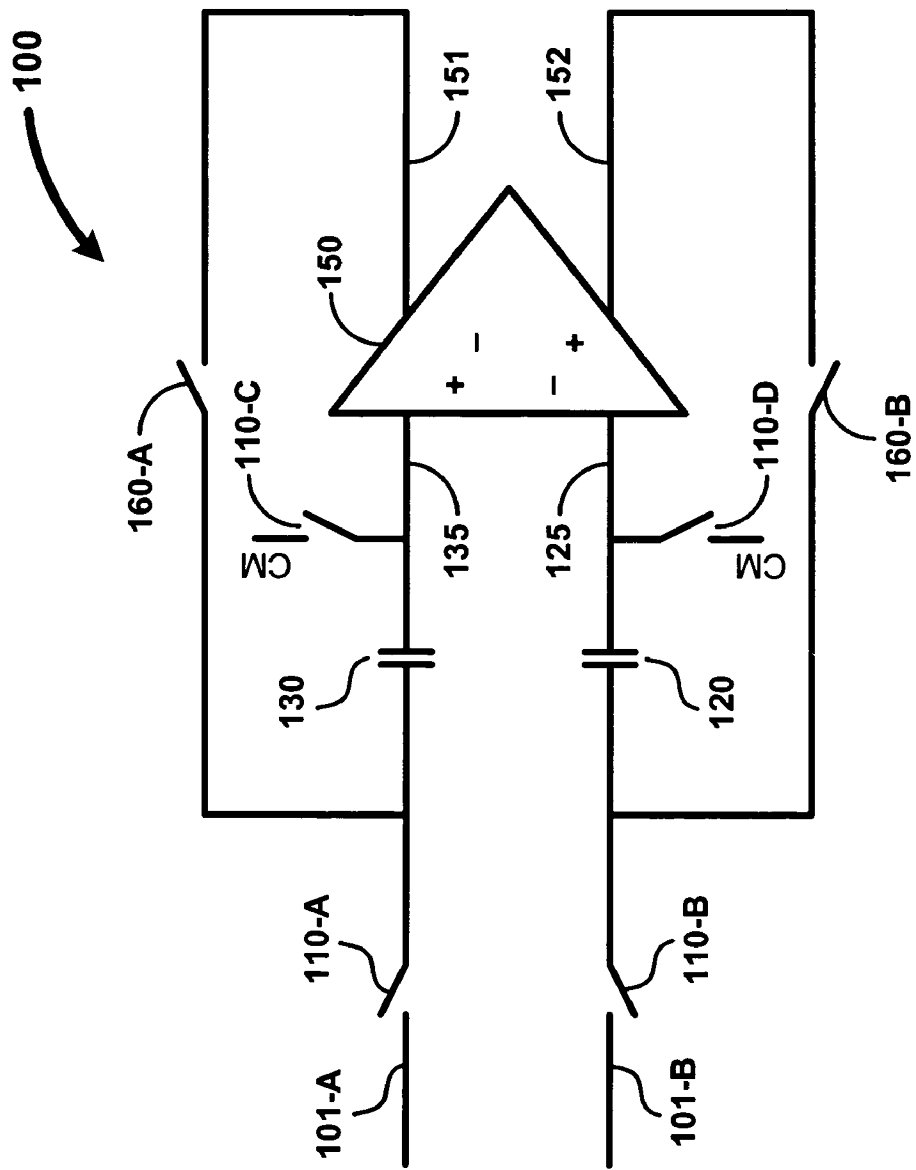
FIG. 1A is a circuit diagram of a prior sample and hold amplification (SHA) circuit illustrating an example environment in which the present invention can be implemented.

FIG. 1A is a circuit diagram of a sample and hold amplification (SHA) circuit illustrating an example prior embodiment which can be improved according to various aspects of the present invention. SHA 100 is shown containing sampling switches 110-A through 110-D, sampling capacitors 120 and 130, amplifier 150, and hold switches 160-A and 160-B. SHA 100 operates as a unity gain amplification circuit by appropriate operation of switched as described below.

Figure 1C:
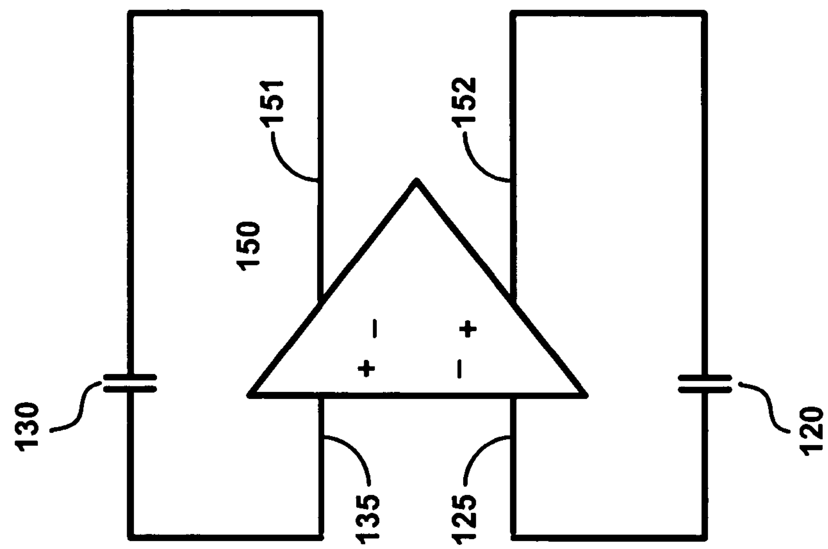
FIG. 1C is a circuit diagram of a SHA circuit in a hold phase.
Figure 1B:
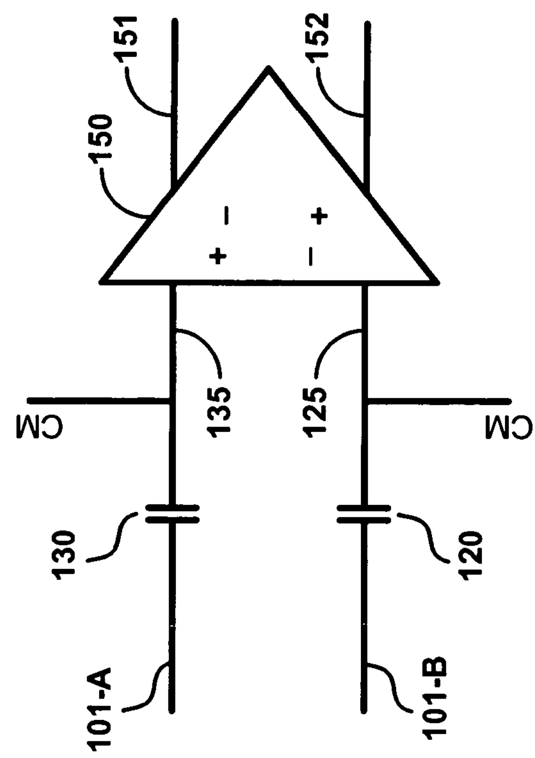
FIG. 1B is a circuit diagram of a SHA circuit in a sample phase.

FIG. 1B is a circuit diagram illustrating the configuration of SHA 100 when sampling switches 110-A through 110-D are closed, and hold switches 160-A and 160-B are open. In such a configuration, a differential signal (inp and inm) provided on paths 101-A and 101-B is sampled onto sampling capacitors 130 and 120 respectively. Such a configuration may be used in one phase of a clock cycle, referred to as a sampling phase.

FIG. 1C is a circuit diagram illustrating the configuration of SHA 100 when sampling switches 110-A through 110-D are open, and hold switches 160-A and 160-B are closed. Assuming a high gain (infinite, ideally) for amplifier 150, the differential input signal sampled in FIG. 1B is provided as an output on outp 151 and outm 152, with an amplification factor of 1.

The description is continued with reference to an example implementation of amplifier 150, illustrating reasons for change of amplification factor during operation.

3. Amplifier

Figure 2:
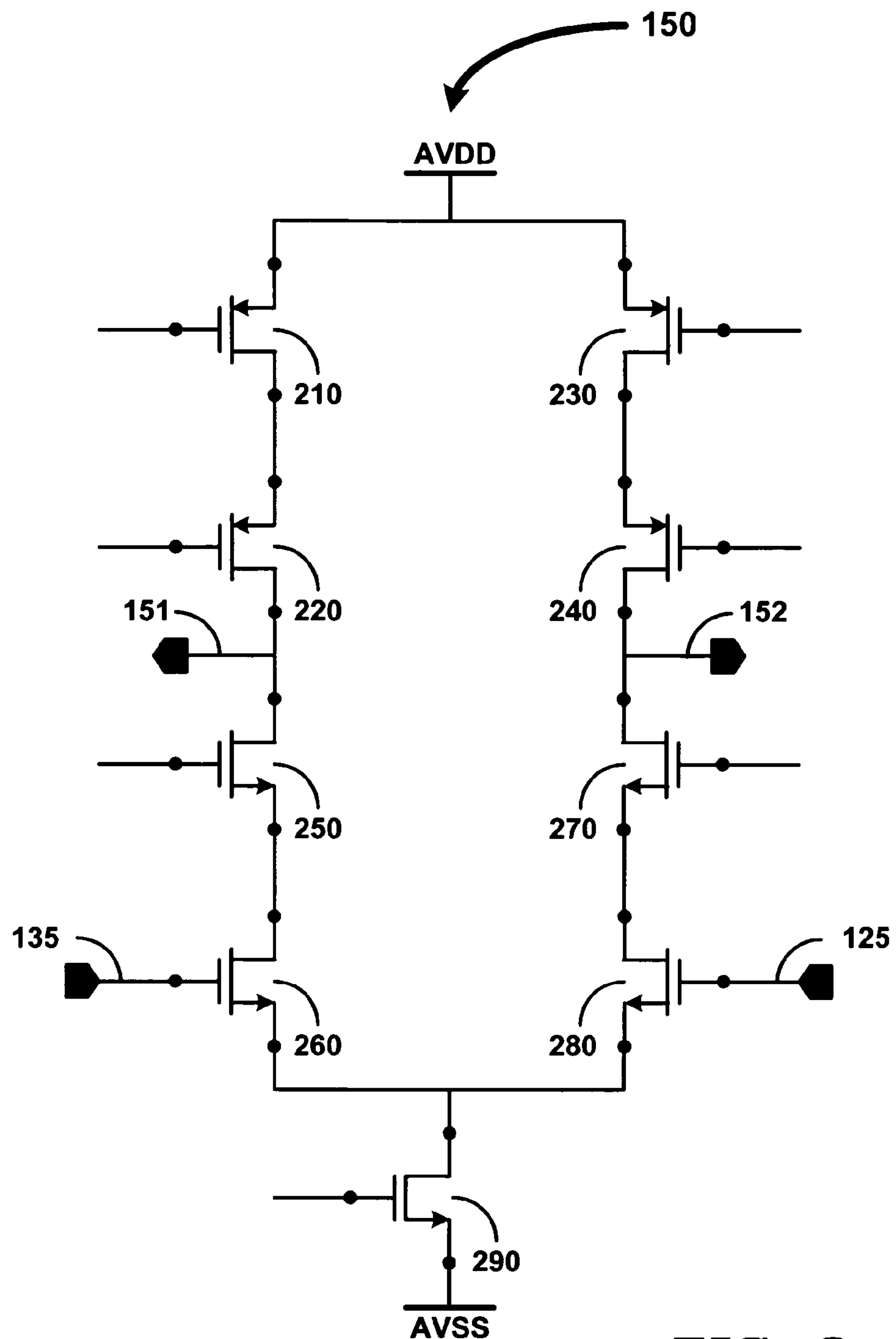
FIG. 2 is a circuit diagram of an amplifier used in an amplification circuit in one embodiment.

FIG. 2 is a circuit diagram illustrating the details of amplifier 150 (commonly referred to as a Cascode amplifier, in the relevant arts) in one embodiment. Amplifier 150 is shown containing PMOS transistors 210, 220, 230 and 240, and NMOS transistors 250, 260, 270, 280 and 290.

The gates of transistors 260 and 280 (operating also as the input terminals of the amplifier 150) get connected to the output of the amplifier through feedback capacitors 130 and 120 respectively (as noted above with reference to FIG. 1C). Transistors 210, 220, 230, 240, 250, 270 and 290 receive constant voltages on their respective gate terminals. The amplified signals outp and outm are provided on paths 151 and 152 respectively.

The gain of amplifier 150 depends, among other factors on the trans-conductance of input transistors 260 and 280, as well as the resistance of output transistors 220, 240, 250 and 270, as is well known in the relevant arts. The resistance of each transistor varies depending on the cross terminal voltages (e.g., gate-to-source voltage, Vgs). As may be readily observed, the trans-conductance of the input transistors varies according to the change (swing) of voltage at the input terminals of amplifier 150, and the resistance of the output transistors varies according to the change of voltage of the output terminals of amplifier 150.

Thus, the gain of amplifier 150 (and thereby the amplification factor of amplification circuit 100) may change during operation, which could lead to a non-linear response of amplification circuit 100. Such non-linearity is undesirable in several environments. The changes are more for a higher total range (swing) of input signal. On the other hand, a large swing is desirable to provide a high signal-to-noise-ratio (SNR).

From the above, it may be appreciated that high voltage swings at the output of the amplification circuit lead to more changes in the amplification factor (and thus to increased non-linearity). The manner in which the changes in amplification factor of amplification circuit 100 may be minimized is described below in further detail.

4. Minimizing Changes

Figure 3:
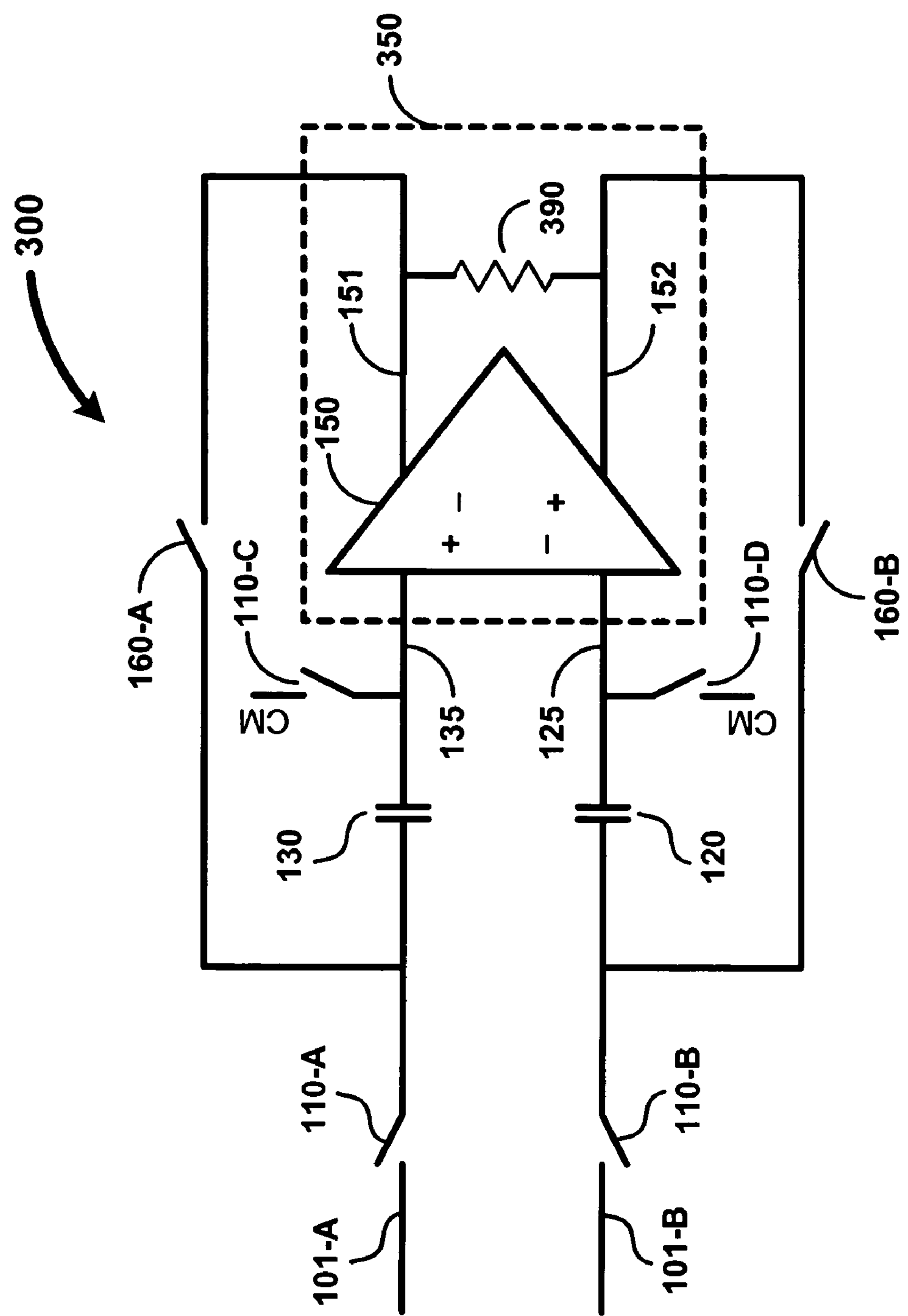
FIG. 3 illustrates the manner in which the change of amplification factor of the amplification circuit of FIG. 1A can be minimized according to an aspect of the present invention.

FIG. 3 is a circuit diagram illustrating the manner in which amplification circuit 100 of FIG. 1A may be modified according to an aspect of the present invention. Only the differences of amplification circuit 300 (of FIG. 3) from amplification circuit 100 (of FIG. 1A) are described for conciseness.

As may be readily observed, resistor 390 is shown connected across the output terminals (151 and 152) of amplifier 150. Resistor 390 generally represents a component, the impedance of which does not change (at least substantially). However, the component can be implemented potentially using other type(s) of components providing invariant impedance. The resistor with an appropriate resistance value minimizes the changes of amplification factor as described below.

5. Theoretical Background

Qualitatively, it is helpful to appreciate that the DC gain of an amplifier is proportionate to the effective output resistance (output impedance) present at the output terminal(s). Assuming that amplifier 150 has an effective output resistance of (R150) and an effective input trans-conductance of H150, the DC gain (A150) of amplifier 150 would be as noted below:

$$A150 \propto R150 \quad \text{Equation (1)}$$

$$A150 \propto H150 \quad \text{Equation (2)}$$

wherein α represents the proportionate relationship.

When resistor 390 is placed across the output terminal(s) of amplifier 150 as shown in FIG. 3, the gain of resulting amplifier 350 would be proportionate to the effective resistance R350, which is a parallel combination of R390 and R150. Similar to equation (2), it would also be proportional to the effective input trans-conductance denoted as H350. Thus, we have:

$$A350 = R350 * H350 \quad \text{Equation (3)}$$

wherein A350 represents the gain between the amplifier input terminals and output terminals. Thus, $$A350 = -Vout/Vx \quad \text{Equation (4)}$$

wherein Vout is the voltage between terminals 151 and 152, and Vx is the voltage between terminals 135 and 125.

Given the parallel connection of resistor 390, the effective resistance R350 is given by the equation:

$$1/R350 = 1/R150 + 1/R390 \quad \text{Equation (5)}$$

Denoting $$S350 = 1/R350 \quad \text{Equation (6)}$$

$$S150 = 1/R150 \quad \text{Equation (7)}$$

$$S390 = 1/R390 \quad \text{Equation (8)}$$

we have (from Equations (5)–(8)):

$$S350 = S150 + S390 \quad \text{Equation (9)}$$

Now, a case in which the resulting amplifier 350 is a component of amplification circuit 300 and is used inside a feedback loop with a feedback factor denoted by B300, is considered. Also the amplification factor of circuit 300, from the input terminals (101-A, 101-B) to the output terminals (151, 152) is denoted by G300. In the particular illustration, $$G300 = Vout/Vin \quad \text{Equation (10)}$$

wherein Vout is the voltage across terminals 151 and 152; and Vin is the voltage across 101-A and 101-B.

As is well known in the relevant arts:

$$G300 = A350/(1 + A350 * B300) \quad \text{Equation (11)}$$

which can be rewritten as:

$$G300 = (1/B300)/\{1/(A350 * B300) + 1\} \quad \text{Equation (12)}$$

Let us consider a case wherein the inverse of the output impedance of amplifier 150 varies with output signal swing as:

$$S150 = Sc * (1 + P * Vout) \quad \text{Equation (12B)}$$

where Sc is a constant, P is the proportionality constant and Vout is the voltage at the output terminal(s) of amplifier 150. As may be appreciated, Sc and P are determined by the manufacturing process.

From equation (9), we have $$S350 = Sc * (1 + P * Vout) + S390 \quad \text{Equation (13)}$$

It is to be noted that S390 is invariant with output swing. Also let us consider a case in which the trans-conductance of the input transistors of amplifier 350 vary with the voltage at the input terminals of amplifier 350 as follows:

$$H350 = Hc/(1 - Q * Vx) \quad \text{Equation (13A)}$$

wherein Hc is a constant, Q is a proportionality constant and Vx is the voltage between the input terminals of the amplifier 350, namely nodes marked 135 and 125. As may be appreciated, Hc and Q are also determined by the manufacturing process used for fabricating the integrated circuit.

From Equations (13A) and (4), we get:

$$H350 = Hc/(1 + Q * Vout/A350) \quad \text{Equation (14)}$$

From Equations (3), (6), (13) and (14), we get $$1/A350 = \{Sc * (1 + P * Vout) + S390\} * \{1 + Q * Vout/A350\}/Hc \quad \text{Equation (15)}$$

The term A350 on the right hand side of Equation (15) can be approximated to be A350C, a constant independent of Vout by making the assumption that:

$$Vout/A350 \sim= Vout/A350C \quad \text{Equation (16)}$$

wherein ~= represents the approximately equal relationship. The assumption is based on the observation that the dependence of A350 on Vout is weak, and thus the dependance of Vout/A350 is dominated by the numerator rather than the denominator.

From equations (3), (13) and (14), we get:

$$1/A350C = (Sc + S390)/Hc \quad \text{Equation (17)}$$

From Equations (15), (16) and (17) we get:

$$1/A350 = \{Sc * (1 + P * Vout) + S390\} * \{1 + Q * Vout * (Sc + S390)/Hc\}/Hc \quad \text{Equation (18)}$$

From equations (12) and (18), we get:

$$G300=(1/B300)/[1+\{Sc*(1+P*Vout)+S390\}*\{1+Q*Vout*(Sc+S390)/Hc\}/(Hc*B300)] \quad \text{Equation (19)}$$

Let us define two of the terms in equation (19) as follows:

$$J=\{Sc*(1+P*Vout)+S390\} \quad \text{Equation (20)}$$

$$K=\{1+Q*Vout*(Sc+S390)/Hc\}/Hc \quad \text{Equation (21)}$$

Thus, from Equations (19)–(21):

$$G300=(1/B300)/[1+J*K/B300] \quad \text{Equation (22)}$$

From Equations (20)–(22) it may be appreciated that the amplification factor (G300) depends on two components J and K. The manner in which the presence of resistor 390 affects each of J and K, and in turn affects sensitivity of G300 to input/output voltage swings is described below.

With respect to J, it can be easily observed from Equation (20) that a non-zero and higher value of S390 would make J less sensitive to changes of Vout (since S390 is invariant). Since the output impedance of the amplifier 350 is a parallel combination of R150 (which varies with output voltage swing) and R390 (which is invariant with output voltage swing), the variation of the effective output impedance with swing gets reduced when R390 is added across output terminals of amplifier 150.

Thus, by choosing a smaller resistance for resistor 390, the value of J would be less sensitive to changes in Vout. By having J being less sensitive, G300 may also be less sensitive to changes in Vout.

With respect to K (Equation 21), a higher value of S390 would make K (and thus G300) more sensitive to changes in Vout. Such a result may be appreciated by noting that the addition of R390 causes the DC gain of amplifier 350 to be less than the DC gain of amplifier 150. This in turn causes the voltage at the amplifier input terminals (denoted as Vx) to be larger in the case of amplifier 350 than amplifier 150 for the same output voltage swing Vout. This in turn results in a larger variation of the trans-conductance of the input transistors with output voltage swing in amplifier 350 as compared to amplifier 150.

Accordingly, an increase in value of S390 may effectively increase of decrease the sensitivity of G300 depending upon the other factors that form part of Equation 19. For a given manufacturing process (which determines the specific/fixed values of Sc, P, Hc, Q), Equation (19) can be used (in a known way) to find an optimum value of R390 for which the variation of G300 with change in Vout is minimized.

The approach(es) described above can be used in conjunction with several types of signals. For example, when used in a feedback circuit as illustrated in FIG. (3), amplification circuit 350 may be required to process an input sinusoidal signal. It may be readily appreciated that a lower variation of G300 with Vout causes the harmonic content at the output of 350 to be minimized. This technique of using R390 at the output terminals can therefore be used to process a sinusoidal signal with a lower total harmonic distortion.

Even though shown as being external to amplifier 150, resistor 390 may be integrated within amplifier 150, as will be apparent to one skilled in the relevant arts by reading the disclosure provided herein. In addition, various aspects of the present invention can be implemented in the context of single ended applications as well.

Furthermore, a specific nature of dependance on output swing is considered above merely for illustration. However, the approaches can be used to address other types of dependencies as well, as will be apparent to one skilled in the relevant arts by reading the disclosure provided herein. Such approaches are also contemplated to be within the scope and spirit of various aspects of the present invention. An example system (or device) using amplifiers is described below in further detail.

6. Example Device

Figure 4:
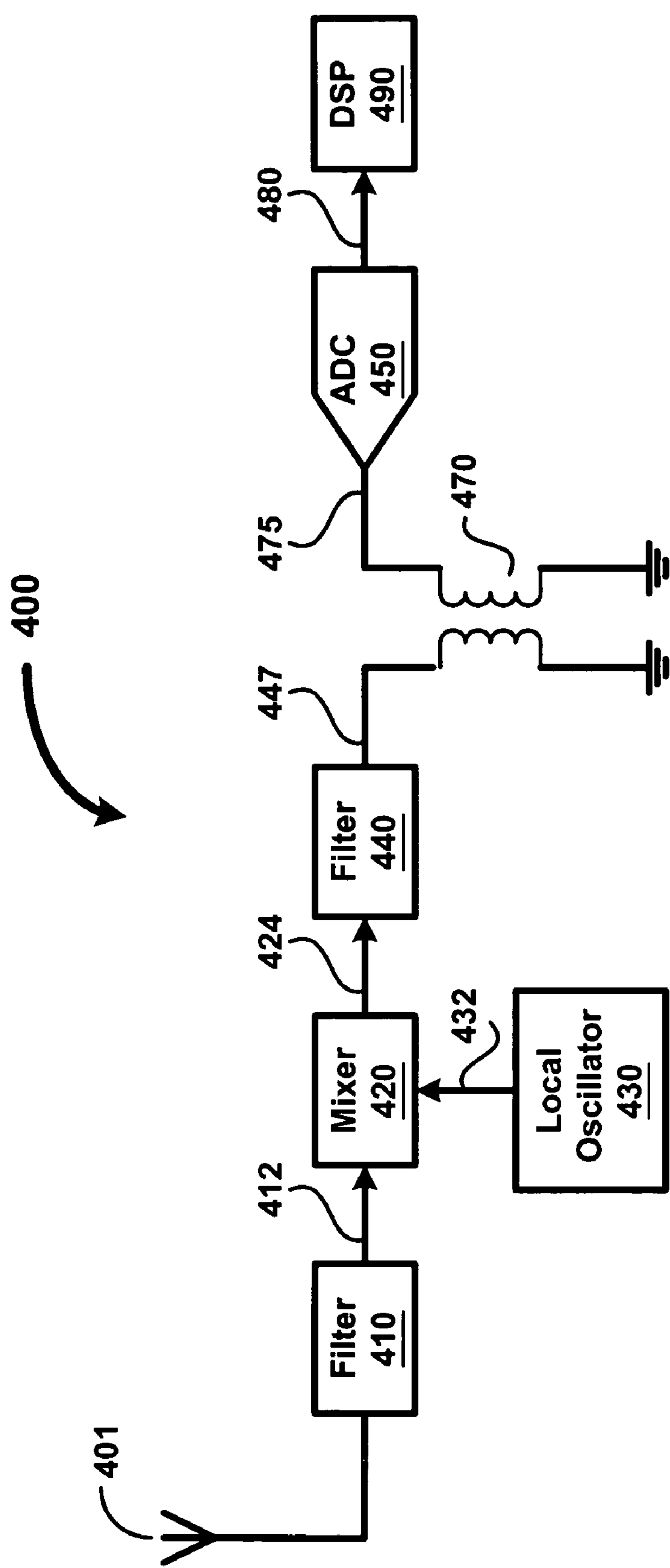
FIG. 4 is a block diagram of a wireless base station illustrating an example device in which various aspects of the present invention can be implemented.

FIG. 4 is a block diagram of wireless base station system 400 illustrating an example system in which the present invention may be implemented. For illustration, it is assumed that wireless base station system 400 is implemented to transfer signals corresponding to mobile phone, etc. However, various aspects of the present invention can be implemented in other communication systems (e.g., data processing systems, etc.).

Wireless base station system 400 is shown containing antenna 401, filters 410 and 440, mixer 420, local oscillator 430, analog to digital converter (ADC) 450, voltage source 460, transformer 470, transmission line 480, and digital signal processor (DSP) 490. Each component is described in further detail below.

Antenna 401 may receive various signals transmitted from mobile phones, other wireless base stations, etc. The received signals may be provided to filter 410. Filter 410 may perform a corresponding transfer function to generate signals of the frequencies of interest. The generated signals are provided on path 412 to mixer 420. Antenna 401 and filter 410 may be implemented in a known way.

Local oscillator 430 generates a signal with a fixed frequency and provides the fixed frequency signal on path 432. In an embodiment, the signal (on path 432) of fixed frequency may be generated by a phase locked loop, crystal, etc. in a known way.

Mixer 420 may be used to convert a high frequency signal to a signal having any desired frequency. In an embodiment, a signal of frequency 1575 MHz is converted to a 4 Mhz signal. Mixer 420 receives filtered signal on path 412 and a signal of fixed frequency on path 432 as inputs and provides the signal with a desired frequency on path 424.

Filter 440 filters the signal received on path 424 to remove any noise components that may be present. In general, a mixer generates noise and the output of mixer contains various noise components including the signal with desired frequency. Filter 440 provides the signal with desired frequency only on path 447. Mixer 420, local oscillator 430, and filter 440 may also be implemented in a known way.

Transformer 470 amplifies the signal received on path 447 to generate an amplified signal. The amplified signal may be provided to analog to digital converter (ADC) 450 on path 475.

ADC 450 converts the analog signal received on path 475 to a corresponding digital code on path 465. The digital code may be provided to DSP 490 through transmission line 480. ADC 450 may be implemented in the form of a pipeline ADC containing multiple stages connected in sequence. Each stage in turn may contain a digital to analog converter (DAC) to convert a corresponding input signal to a sub-code, and to amplify a difference of the input signal and a voltage equivalent of the sub-code.

An amplification circuit may be used within each of several stages, and the amplification circuit may be implemented using various approaches described above. The amplifier signal is provided as an input to a subsequent stage. A code converter converts the sub-code into a digital code.

DSP 490 (example of a processing block) receives the digital code to provide various user applications (such as telephone calls, data applications).

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An amplification circuit amplifying an input signal to generate an output signal, said amplification circuit comprising:

an amplifier amplifying said input signal, wherein a gain of said amplifier changes when amplifying said input signal; and a component provided across an output of said amplifier, wherein an impedance of said component does not chance when amplifying said input signal such that changes in an amplification factor provided by said amplification circuit are minimized when amplifying said input signal to generate said output signal, wherein said component comprises a resistor, and wherein said amplifier contains a first output terminal and a second output terminal, and wherein said resistor is connected to both of said first output terminal and said second output terminal, a feedback circuit across said amplifier, wherein a resistance value of said resistor is chosen using the equation:

$$G300=(1/B300)/[1+\{Sc*(1+P*Vout)+S390\}*\{1+Q*Vout*(Sc+S390)/Hc\}/(Hc*B300)],$$

wherein said resistance=(1/S390), G300 represents an amplification factor of said amplification circuit, B300 represents a feedback factor of said feedback circuit, Sc, P, Q and Hc are determined by a manufacturing process used to implement said amplification circuit.

2. The amplification circuit of claim 1, wherein said resistor is integrated into said amplifier.

3. A device comprising:

an amplification circuit amplifying an input signal to generate an output signal, said amplification circuit comprising:

an amplifier amplifying said induct signal, wherein a gain of said amplifier changes when amplifying said input signal; and a component provided across an output of said amplifier, wherein an impedance of said component does not change when amplifying said input signal such that changes in an amplification factor provided by said amplification circuit are minimized when amplifying said input signal to generate said output signal, wherein said component comprises a resistor, wherein said amplifier contains a first output terminal and a second output terminal, and wherein said resistor is connected to both of said first output terminal and said second output terminal, and wherein said amplification circuit further comprises a feedback circuit, across said amplifier, wherein a resistance value of said resistor is chosen using the equation:

$$G300=(1/B300)/[1+\{Sc*(1+P*Vout)+S390\}*\{1+Q*Vout*(Sc+S390)/Hc\}/(Hc*B300)],$$

wherein said resistance=(1/S390), G300 represents an amplification factor of said amplification circuit, B300 represents a feedback factor of said feedback circuit, Sc, P, Q and Hc are determined by a manufacturing process used to implement said amplification circuit.

4. The device of claim 3, wherein said resistor is integrated into said amplifier.

5. The device of claim 3, wherein said device comprises a wireless base station, said device further comprising:

an antenna receiving an external signal;

an analog processor processing said external signal to generate said input signal; and an analog to digital converter converting said output signal to a sequence of digital codes.

6. A method of implementing an amplification circuit for amplifying an input signal to generate an output signal, said method comprising:

providing an amplifier to amplify said input signal, wherein a gain of said amplifier changes when amplifying said input signal;

providing a component across an output of said amplifier, wherein an impedance of said component does not changes when amplifying said input signal such that changes in an amplification factor provided by said amplification circuit are minimized when amplifying said input signal to generate said output signal, wherein said component comprises a resistor, wherein said amplifier contains a first output terminal and a second output terminal, and wherein said resistor is connected to both of said first output terminal and said second output terminal, and a feedback circuit across said amplifier, wherein a resistance value of said resistor is chosen using the equation:

$$G300=(1/B300)/[1+\{Sc*(1+P*Vout)+S390\}*\{1+Q*Vout*(Sc+S390)/Hc\}/(Hc*B300)] \quad \text{Equation (19)}$$

wherein said resistance=(1/S390), G300 represents an amplification factor of said amplification circuit, B300 represents a feedback factor of said feedback circuit, Sc, P, Q and Hc are determined by a manufacturing process used to implement said amplification circuit.

* * * * *